[19] United States Patent
Komino et al.

[11] Patent Number: 6,134,807
[45] Date of Patent: Oct. 24, 2000

[54] DRYING PROCESSING METHOD AND APPARATUS USING SAME

[75] Inventors: Mitsuaki Komino, Nakano-ku; Osamu Uchisawa, Sendai, both of Japan

[73] Assignees: Tokyo Electron Limited, Tokyo; Motoyama Eng. Works, Ltd., Miyagi, both of Japan

[21] Appl. No.: 09/079,768

[22] Filed: May 15, 1998

[30] Foreign Application Priority Data

May 16, 1997 [JP] Japan ..................................... 9-141112

[51] Int. Cl.⁷ .................................................. F26B 7/00
[52] U.S. Cl. .................................. 34/418; 34/467; 34/77; 34/78
[58] Field of Search ................................. 432/241, 239, 432/242; 34/77, 78, 73, 164, 381, 418, 429, 397, 401, 467

[56] References Cited

U.S. PATENT DOCUMENTS

| 4,777,970 | 10/1988 | Kusuhara | 134/66 |
|---|---|---|---|
| 4,878,931 | 11/1989 | Grant | 62/17 |
| 4,967,486 | 11/1990 | Doelling | 32/1 |
| 4,982,512 | 1/1991 | McClenny | 34/77 |
| 5,052,126 | 10/1991 | Moe et al. | 34/78 |
| 5,054,210 | 10/1991 | Schumacher et al. | 34/78 |
| 5,222,307 | 6/1993 | Oba et al. | 34/13 |
| 5,226,242 | 7/1993 | Schwenkler | 34/78 |
| 5,249,371 | 10/1993 | Saito et al. | 34/78 |
| 5,351,419 | 10/1994 | Franka et al. | 34/470 |
| 5,369,891 | 12/1994 | Kamikawa | 34/78 |
| 5,371,950 | 12/1994 | Schumacher | 34/78 |
| 5,443,540 | 8/1995 | Kamikawa | 34/471 |
| 5,535,525 | 7/1996 | Gardner | 34/78 |
| 5,539,995 | 7/1996 | Bran | 34/77 |
| 5,555,634 | 9/1996 | Uchiyama et al. | 34/78 |
| 5,575,079 | 11/1996 | Yokomizo et al. | 34/78 |
| 5,657,553 | 8/1997 | Tarui et al. | 34/78 |
| 5,671,544 | 9/1997 | Yokomizo et al. | 34/78 |
| 5,709,037 | 1/1998 | Tanaka et al. | 34/330 |
| 5,749,159 | 5/1998 | Schwenkler | 34/426 |
| 5,752,532 | 5/1998 | Schwenkler | 134/102.3 |
| 5,815,942 | 10/1998 | Wu et al. | 34/78 |
| 5,884,640 | 3/1999 | Fishkin et al. | 134/95.2 |
| 5,940,985 | 8/1999 | Kamikawa et al. | 34/471 |
| 5,950,328 | 9/1999 | Ichiko et al. | 34/364 |

FOREIGN PATENT DOCUMENTS

| 5-243205 | 9/1993 | Japan . |
|---|---|---|
| 2544971 | 7/1996 | Japan . |

*Primary Examiner*—Stephen Gravini
*Assistant Examiner*—Andrea M. Joyce
*Attorney, Agent, or Firm*—Morrison & Foerster

[57] ABSTRACT

A drying processing apparatus for supplying a dry gas to a processing chamber 35, which houses therein semiconductor wafers W, to dry the semiconductor wafers W, including a heater 32 for heating $N_2$ gas serving as a carrier gas; a vapor generator 34 for making IPA misty by using the $N_2$ gas heated by the heater 32 and for heating the IPA to produce the dry gas; and a flow control element 36 for supplying a predetermined rate of $N_2$ gas to the processing chamber 35. Thus, it is possible to improve the efficiency of heat transfer of $N_2$ gas, and it is possible to increase the amount of produced IPA gas and decrease the time to produce IPA gas. In addition, it is possible to prevent the turbulence of atmosphere in the processing chamber 35 after the drying processing is completed.

10 Claims, 11 Drawing Sheets

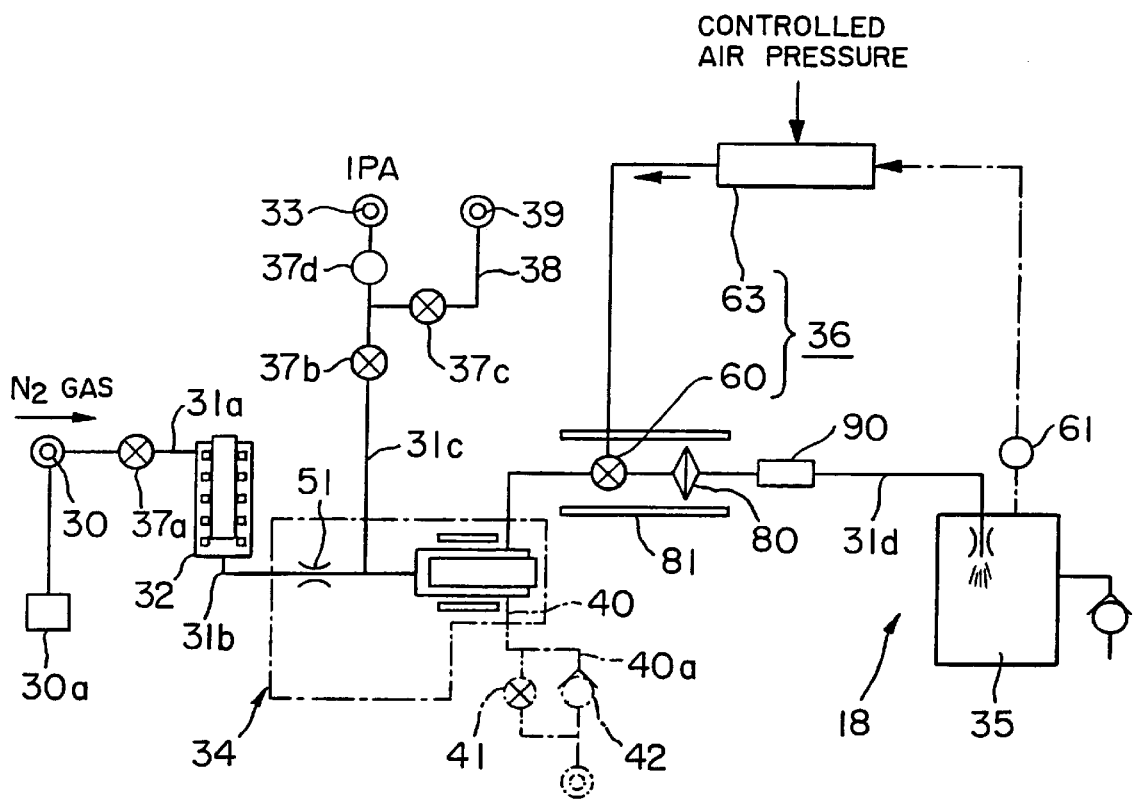
F I G. 12

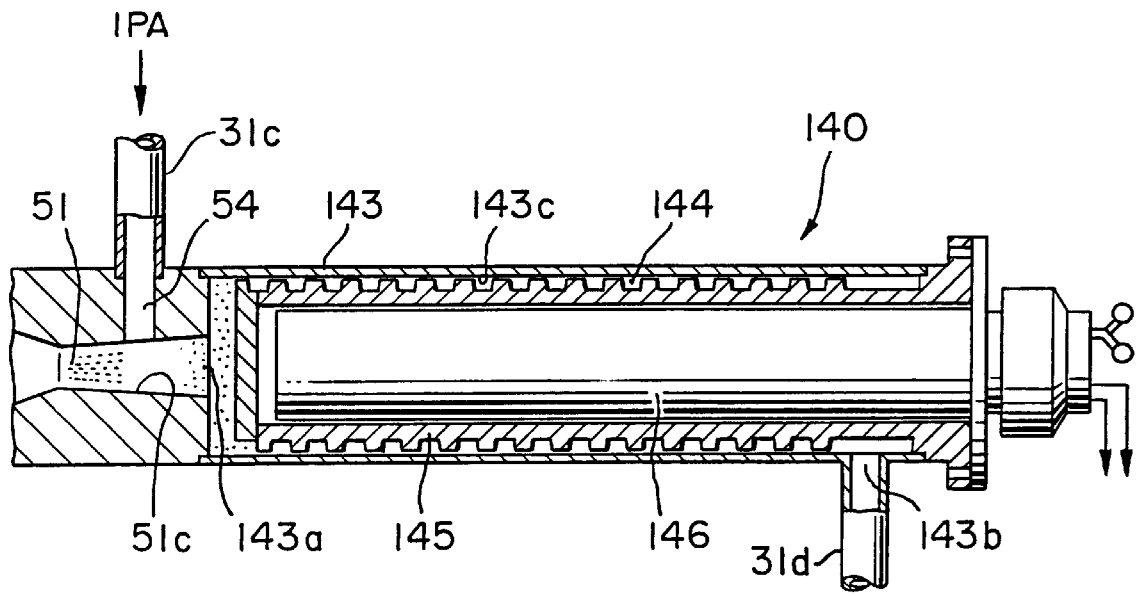
F I G. 13(a)
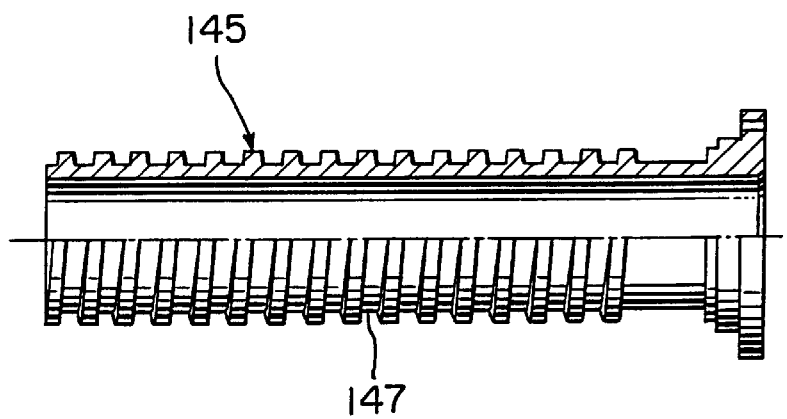
F I G. 13(b)

DRYING PROCESSING METHOD AND APPARATUS USING SAME

BACKGROUND OF THE INVENTION

1. Field of the Invention

The present invention relates generally to a drying processing method and an apparatus using the drying processing method. More specifically, the invention relates to a drying processing method for drying an object to be treated, such as a semiconductor wafer and a glass substrate for a LCD, by allowing the object to be in contact with a dry gas, and an apparatus using the drying processing method.

2. Related Background Art

In a typical manufacturing processing in a semiconductor equipment, there has been widely used a cleaning processing method for sequentially immersing an object to be treated (hereinafter referred to as a "wafer"), such as a semiconductor wafer and a glass substrate for a LCD, in a treatment solution, such as a chemical and a rinse solution (a cleaning solution), which is stored in a processing bath. Such a cleaning processing apparatus has a drying processing apparatus for allowing a dry gas, which is of a vapor of a volatile solvent, such as IPA (isopropyl alcohol), to be in contact with the surface of the cleaned wafer to cause the dry gas to be condensed or adsorbed to remove the moisture of the wafer and dry the wafer (see Japanese Patent Laid-Open No. 8-45893).

As described in Japanese Patent Laid-Open No. 8-45893, a conventional drying processing apparatus of this type comprises: a carrier gas supply part for supplying a carrier gas, e.g., nitrogen ($N_2$) gas; a vapor generator, which has multistage evaporating dishes for receiving a dry gas, e.g., IPA (isopropyl alcohol), and a heater; a main supply passage having a shut-off valve provided therein for supplying a vapor generated by the vapor generator, i.e., a dry gas, to a drying processing chamber; and a heater for heating the main supply passage.

According to the conventional drying processing apparatus with this construction, $N_2$ gas is supplied from the $N_2$ gas source to the vapor generator to be mixed with the IPA gas vaporized by the vapor generator to be supplied to the processing chamber via the main supply passage, so that the wafer housed in the processing chamber contacts the IPA gas to remove the moisture of the wafer and dry the wafer.

However, in this type of conventional drying processing apparatus, the dry gas is produced in the vapor generator having multistage evaporating dishes, so that the heat capacity of the vapor generator is limited. Thus, there is a problem in that the amount of evaporation of IPA is limited to lower the evaporative power. Therefore, there is a problem in that it takes too much time until the supply of the IPA to the vapor generator is stopped after the IPA is supplied to the vapor generator, i.e., until the generation of the IPA gas is stopped after the IPA gas is generated.

In addition, since the vapor generator has the multistage evaporating dishes, there is a problem in that the size of the whole system is large.

Moreover, when the drying processing includes a step of reducing the pressure in the processing chamber to a pressure lower than atmospheric pressure, it is required to prevent the atmosphere in the processing chamber from excessively changing when the state in the processing chamber at a pressure lower than atmospheric pressure returns to the atmospheric pressure state. Because particles caused by the excessive variation in the processing chamber must be prevented from being raised and so forth. Therefore, a very small amount of $N_2$ gas must be supplied to the processing chamber, so that there are problems in that it takes a lot of time and the treating capacity is lowered. However, there is no concrete means for solving these problems in the present circumstances.

SUMMARY OF THE INVENTION

It is therefore an object of the present invention to eliminate the aforementioned problems and to provide a drying processing method, which can improve the efficiency of heat transfer of a heating means for heating a carrier gas and which can increase the amount of produced dry gas and decrease the vapor generating time, the drying processing method being capable of preventing the turbulence of atmosphere in a processing chamber after the drying processing is completed.

In order to accomplish the aforementioned and other objects, according to one aspect of the present invention, there is provided a drying processing method for supplying a dry gas to a processing chamber, which houses therein an object to be treated, to dry the object to be treated, the method comprising the steps of heating a carrier gas; making a liquid for said dry gas misty by using the heated carrier gas, and by heating the misty liquid to produce said dry gas; and supplying the dry gas to the processing chamber while controlling the flow rate of the dry gas.

According to another aspect of the present invention, there is provided a drying processing apparatus for supplying a dry gas to a processing chamber, which houses therein an object to be treated, to dry the object to be treated, the apparatus comprising: carrier gas heating means for heating a carrier gas; and vapor generator means for making a liquid for said dry gas misty by using the carrier gas heated by the heating means and for heating the misty liquid to produce said dry gas.

The drying processing apparatus may further comprise flow control means for supplying the dry gas to the processing chamber at a predetermined rate.

The carrier gas heating means may comprise: an introducing pipe, which communicates with a carrier gas supply line; a fluid passage forming pipe, which is inserted into the introducing pipe to form a spiral fluid passage between an inner wall surface of the introducing pipe and the fluid passage forming pipe; and heating means, which is inserted into at least the fluid passage forming pipe.

Alternatively, the carrier gas heating means comprise: an introducing pipe, which communicates with a carrier gas supply line; a coil member, which is inserted into the introducing pipe to form a spiral fluid passage between an inner wall surface of the introducing pipe and the coil member; and heating means, which is inserted into at least the coil member.

The vapor generator means may have any constructions for making a liquid for the dry gas misty by the carrier gas heated by the heating means and for heating the misty liquid to produce the dry gas. For example, the vapor generator means may comprise: a shock wave forming part, which is formed in a tubular body communicating with a carrier gas supply line; a supply port for supplying the liquid for the dry gas to a location near the shock wave forming part; and heating means provided inside and/or outside the tubular body near or downstream of the shock wave forming part and the supply port.

Preferably, the flow control means comprises: an opening-angle adjusting valve provided in a supply line; a control part for comparing a signal outputted from detecting means for detecting a pressure in the processing chamber, with a previously stored information; and a control valve for controlling a working pressure of the opening-angle adjusting valve on the basis of a signal outputted from the control part.

Preferably, the drying processing apparatus further comprises temperature detecting means for detecting a temperature of the dry gas, the temperature detecting means being provided in a supply line for the dry gas. In this case, the temperature detecting means preferably comprises a thermocouple, which is fixed to a metal seal member by welding, the metal seal member being provided between a receiving nut fixed to a tubular body forming the supply line and a mounting nut engaged with the receiving nut.

According to the present invention, the carrier gas supplied from the carrier gas source is heated to be supplied to the vapor generator means. In the vapor generator means, the liquid for the dry gas, which is supplied to the vapor generator means, can be made misty by using the carrier gas to be heated by the heating means to produce the dry gas. Then, the produced dry gas is supplied to the processing chamber, so that the objects to be treated, which are housed in the processing chamber, can contact the dry gas to dry the objects to be treated.

In addition, a predetermined small amount of dry gas is supplied to the processing chamber while being controlled by the flow control means. Thus, even if the drying processing includes a step of reducing the pressure in the processing chamber to a pressure lower than atmospheric pressure, it is possible to inhibit the atmosphere in the processing chamber from rapidly changing from a reduced pressure to atmospheric pressure, and it is possible to prevent particles from being raised and adhered to objects to be treated.

When the carrier gas heating means comprises: an introducing pipe communicating with a carrier gas supply line; a fluid passage forming pipe, which is inserted into the introducing pipe to form a spiral fluid passage between the inner wall surface of the introducing pipe and the fluid passage forming pipe; and heating means inserted into the fluid passage forming pipe, or when a coil member is substituted for the fluid passage forming pipe to form the spiral fluid passage, it is possible to increase the contact area of the carrier gas to the heating means and the contact residence time. In addition, it is possible to improve the efficiency of heat transfer of the carrier gas heating means, and it is possible to supply a carrier gas of a predetermined temperature to the vapor generator means. Therefore, it is possible to decrease the size of the carrier gas heating means, and it is possible to improve the efficiency of generation of the dry gas.

When the vapor generator means generally comprises: a shock wave forming part, which is formed in a tubular body communicating with a carrier gas supply line; a supply port for supplying a liquid for a dry gas to a location near the shock wave forming part; and heating means provided inside and/or outside the tubular body near or downstream of the shock wave forming part and the supply port, it is possible to efficiently and quickly produce a dry gas from the liquid for the dry gas. Therefore, it is possible to improve the efficiency of drying processing and it is possible to decrease the size of the vapor generator means.

When the flow control means comprises: an opening-angle adjusting valve provided in a supply line; a control part for comparing a signal outputted from detecting means for detecting a pressure in the processing chamber, with a previously stored information; and a control valve for controlling a working pressure of the opening-angle adjusting valve on the basis of a signal outputted from the control part, it is possible to control the opening-angle adjusting valve in accordance with the variation in pressure in the processing chamber. In addition, even if the drying processing includes a step of reducing the pressure in the processing chamber to a pressure lower than atmospheric pressure, the atmospheric pressure in the processing chamber can be smoothly changed from a reduced pressure to atmospheric pressure after the drying is completed. Therefore, it is possible to prevent particles from being raised when the atmosphere in the processing chamber is changed from the reduced pressure to atmospheric pressure, and it is possible to prevent particles from being adhered to the objects to be treated.

In addition, when temperature detecting means for detecting the temperature of the dry gas is provided in the supply line for the dry gas, it is possible to maintain the optimum state of the temperature of the dry gas. In this case, when the temperature detecting means comprises a thermocouple, which is fixed to a metal seal member by welding, the metal seal member being provided between a receiving nut fixed to a tubular body forming the supply line and a mounting nut engaged with the receiving nut, it is possible to accurately measure the temperature of the dry gas, and it is possible to prevent the external leakage, so that it is possible to enhance the reliability of the temperature detecting means with respect to the temperature cycle.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 12 is a schematic block diagram of another preferred embodiment of a drying processing apparatus according to the present invention; and FIG. 13(a) is a sectional view of another preferred embodiment of a heater of a vapor generator according to the present invention, and FIG. 13(b) is a local sectional view of a principal part of the heater of FIG. 13(a).

DESCRIPTION OF THE PREFERRED EMBODIMENTS

Referring now to the accompanying drawings, the preferred embodiments of the present invention will be described in detail below. The shown embodiments are applied to a cleaning processing system for semiconductor wafers.

Figure 1:
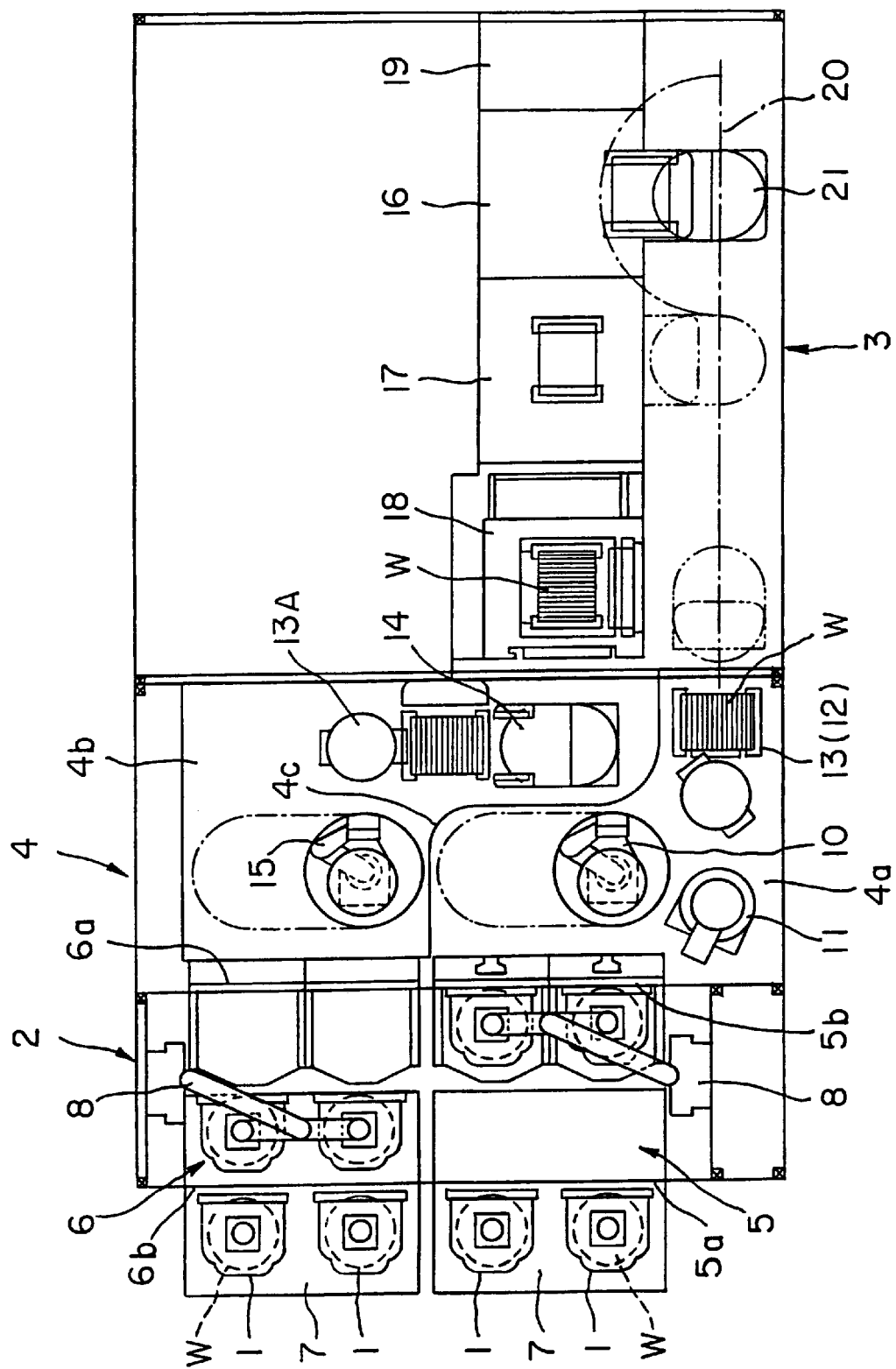
FIG. 1 is a schematic plan view of a cleaning processing system, to which the preferred embodiment of a drying processing apparatus according to the present invention is applied.
Figure 2:
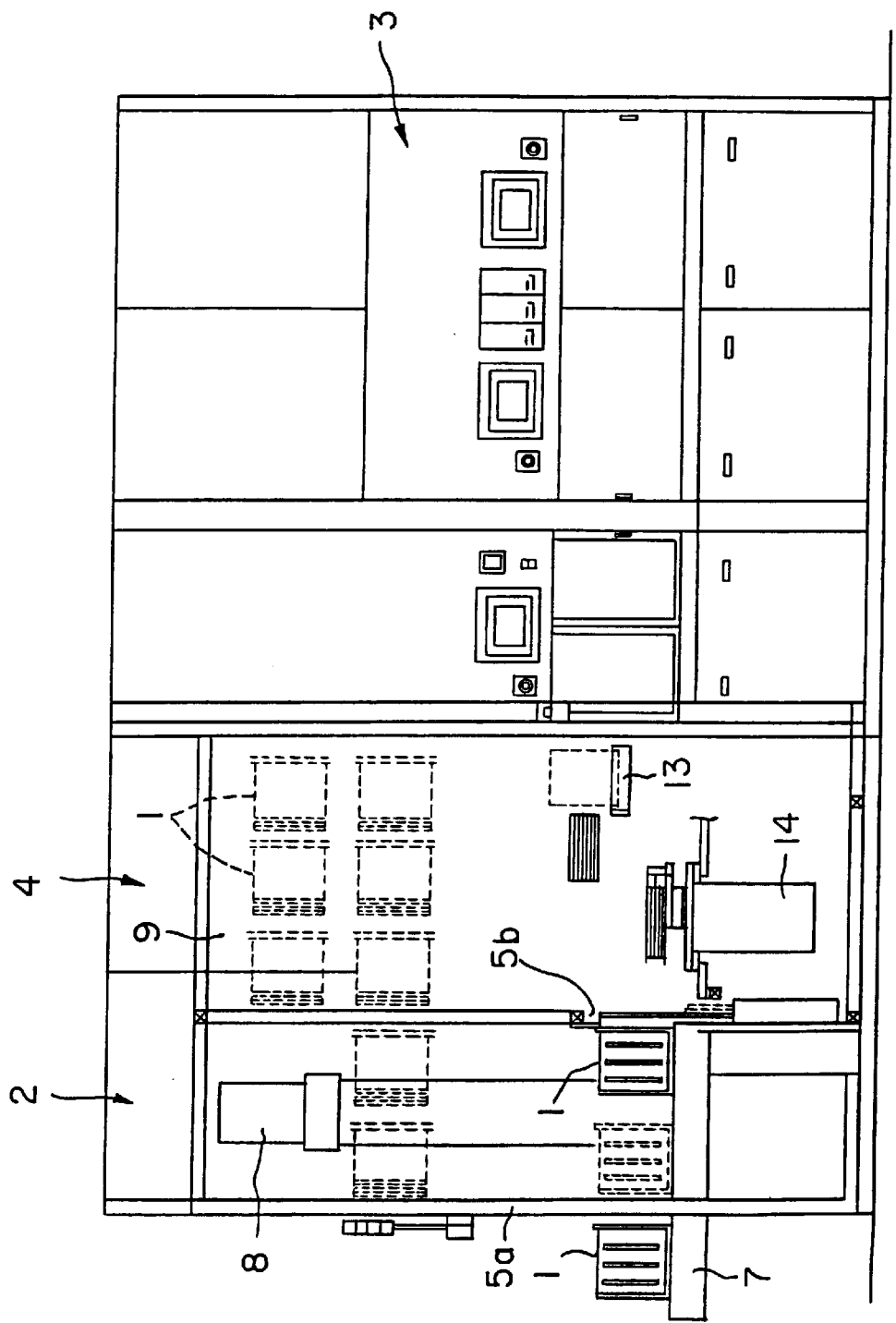
FIG. 2 is a schematic side view of the cleaning processing system of FIG. 1.

FIG. 1 is a schematic plan view of an embodiment of a cleaning processing system, to which the preferred embodiment of a drying processing apparatus according to the present invention is applied, and FIG. 2 is a schematic side view of the cleaning processing system of FIG. 1.

The cleaning processing system generally comprises: a transport section 2 for performing the carrying in and out of a container, e.g., carrier 1, which houses therein semiconductor wafers W (which will be hereinafter referred to "wafers"), which are objects to be treated; a treatment section 3 for treating the wafers W with a solution, such as a chemical and a cleaning solution, and for drying the wafers W; and an interface section 4, arranged between the transport section 2 and the treatment section 3, for performing the delivery, position adjustment and attitude change of the wafers W.

The transport section 2 comprises an introducing part 5 and a discharging part 6, which are provided side by side on one side of the cleaning processing system. At each of the introducing port 5a of the introducing part 5 and the discharging port 6b of the discharging part 6, a slidable mount table 7 for carrying the carrier 1 in and out of each of the introducing port 5a and the discharging port 6b is provided. Each of the introducing part 5 and the discharging part 6 is provided with a carrier lifter 8 (a container transport means), by which the carrier 1 can be transported between the introducing parts or between the discharging parts and by which an empty carrier 1 can be delivered to a carrier waiting section 9 provided above the transport section 2 and can be received from the carrier waiting section 9 (see FIG. 2).

The interface section 4 is divided by a partition wall 4c into a first chamber 4a adjacent to the introducing part 5 and connected thereto by port 5b, and a second chamber 4b adjacent to the discharging part 6 and connected thereto by port 6a. The first chamber 4a houses therein: a wafer unloading arm 10 (a substrate unloading means) for unloading a plurality of wafers W from the carrier 1 in the input part 5 to transport the wafers W, the wafer unloading arm 10 being movable in horizontal directions (X, Y directions) and vertical directions (Z directions) and rotatable (in θ directions); a notch aligner 11 (a position detecting means) for detecting a notch formed in each of the wafers W; a space adjusting means 12 for adjusting the space between the adjacent wafers W unloaded by the wafer unloading arm 10; and a first attitude changing unit 13 (an attitude changing means) for changing the attitude of the wafer W from the horizontal state to the vertical state.

The second chamber 4b houses therein: a wafer delivering arm 14 (a substrate transporting means) for receiving a plurality of treated wafers W from the treatment section 3 to transport the wafers W while maintaining the vertical state of the wafers W; a second attitude changing unit 13A (an attitude changing means) for changing the attitude of the wafers W received from the wafer delivering arm 14, from the vertical state to the horizontal state; and a wafer loading arm 15 (a substrate loading means) for receiving the plurality of wafers W changed to the horizontal state by the second attitude changing unit 13A, to load the wafers W in an empty carrier 1 transported to the discharging part 6, the wafer loading arm 15 being movable in horizontal directions (X, Y directions) and vertical directions (Z directions) and rotatable (in θ directions). Furthermore, the second chamber 4b is sealed, and the interior thereof is replaced with an inert gas, e.g., $N_2$ gas supplied from a nitrogen ($N_2$) gas source (not shown).

The treatment section 3 includes: a first treatment unit 16 for removing particles and organic contamination, which are adhered to the wafers W; a second treatment unit 17 for removing metal contamination adhered to the wafers W; a drying processing apparatus 18 of the present invention, which is a cleaning/drying processing unit for removing oxide films adhered to the wafers W and for drying the wafers W, and a chuck cleaning unit 19. The first processing unit 16, the second treatment unit 17, the drying processing apparatus 18 and the chuck cleaning unit 19 are aligned with each other. In the treatment section 3, a wafer transport arm 21 (a transport means), which is movable in X and Y directions (horizontal directions) and in Z directions (vertical directions) and rotatable (θ), is provided on a transport channel 20 facing the respective units 16 through 19.

Figure 3:
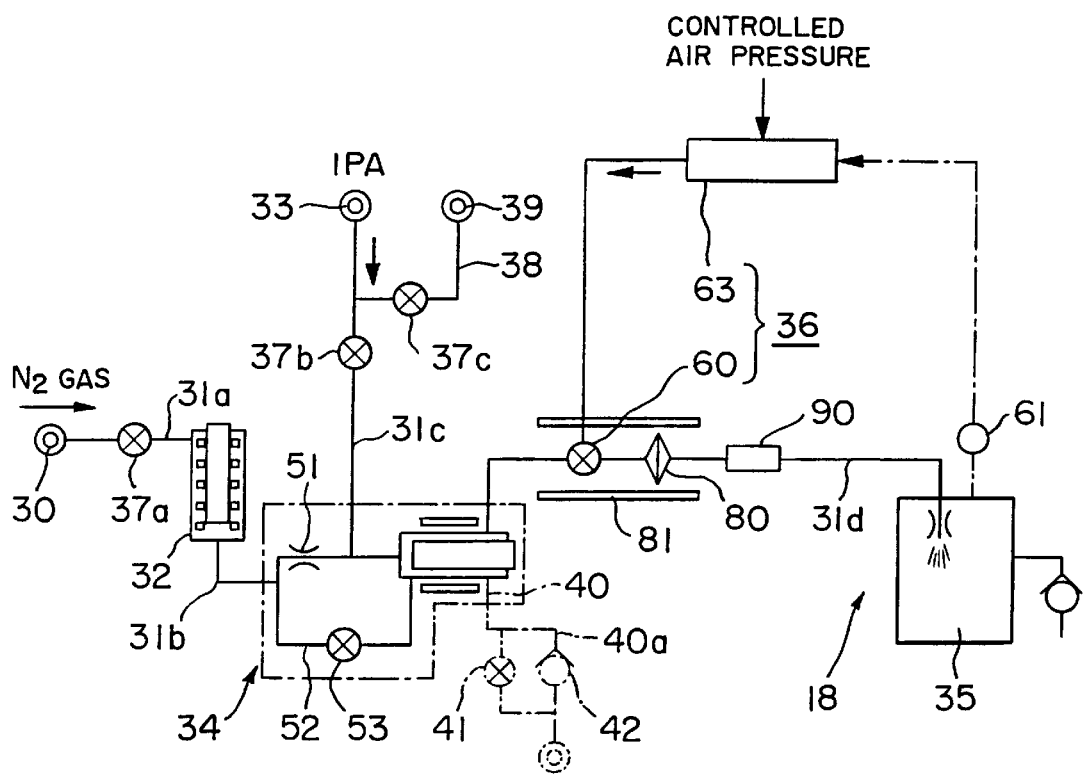
FIG. 3 is a schematic block diagram of the preferred embodiment of a drying processing apparatus according to the present invention.

As shown in FIG. 3, the drying processing apparatus 18 comprises: a $N_2$ gas heater 32 (which will be hereinafter referred to as a "heater") serving as a $N_2$ gas heating means connected to a carrier gas source, e.g., a nitrogen ($N_2$) gas source 30, via a supply line 31a; a vapor generator 34 serving as a vapor generating means, which is connected to the heater 32 via a supply line 31b and which is connected to a source of a liquid for a dry gas, e.g., an IPA source 33, via a supply line 31c; a flow control means 36 provided in a supply line 31d for connecting the vapor generator 34 to a drying processing chamber 35 (which will be hereinafter referred to as a "processing chamber").

In this case, a shut-off valve 37a is provided in the supply line 31a which connects the $N_2$ gas source 30 to the heater 32. In addition, a shut-off valve 37b is provided in the supply line 31c which connects the IPA source 33 to the heater 32. An IPA recovering part 39 is connected to the shut-off valve 37b on the side of the IPA source via a branch line 38 and a shut-off valve 37c. As shown by the two-dot chain line in FIG. 3, if necessary, an IPA drain pipe 40 is connected to the vapor generator 34, and a drain valve 41 is provided in the drain pipe 40, to which a branch line 40a having a check valve 42 is connected. Such connections of the drain pipe 40, the drain valve 41 and so forth are convenient to discharge the cleaning solution and so forth when cleaning the interior of the vapor generator 34.

Figure 4A:
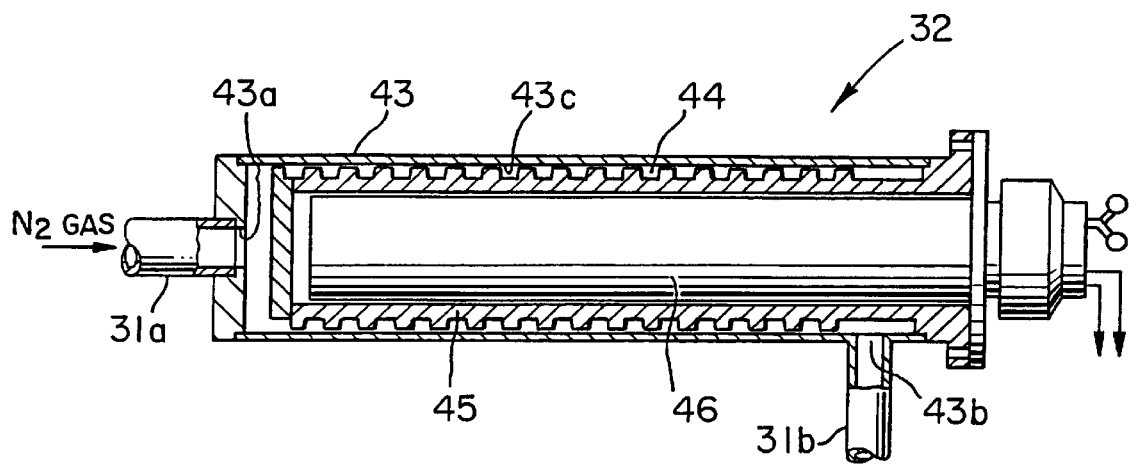
FIG. 4(a) is a sectional view of the preferred embodiment of a carrier gas heater according to the present invention.

As shown in FIG. 4(a), the heater 32 generally comprises: an introducing pipe 43 communicating with the $N_2$ gas supply line 31a; a fluid passage forming pipe 45, which is inserted into the introducing pipe 43 and which forms a spiral fluid passage 44 between the inner wall surface of the introducing pipe 43 and the fluid passage forming pipe 45; and a heating means, e.g., a cartridge heater 46, which is inserted into the fluid passage forming pipe 45.

Figure 4B:
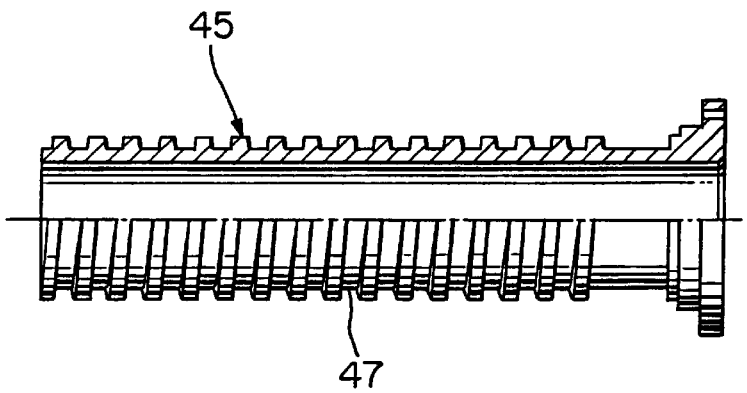
FIG. 4(b) is a local sectional view of a principal part of the carrier gas heater of FIG. 4(a)

In this case, one end of the introducing pipe 43 has an inlet port 43a connected to the supply line 31a, and a side of the other end thereof is provided with an outlet port 43b connected to the supply line 31b. As shown in FIG. 4(b), a spiral groove 47, such as a trapezoidal screw thread, is formed in the outer periphery of the fluid passage forming pipe 45. The spiral fluid passage 44 is formed by the spiral groove 47 and the inner wall surface 43c of the introducing pipe 43. Furthermore, the structure of the spiral fluid passage 44 should not be limited to the above structure. For example, a spiral groove may be formed in the inner wall surface of the introducing pipe 43, and the outer peripheral surface of the fluid passage forming pipe 45 may be a flat surface to form the spiral fluid passage. Alternatively, spiral grooves may be formed in both of the inner wall surface of the introducing pipe 43 and the outer peripheral surface of the fluid passage forming pipe 45 to form the spiral fluid passage. Furthermore, a heater for heating the outside of the introducing pipe 43 may be provided as a heating means in addition to the cartridge heater 46.

Figure 5:
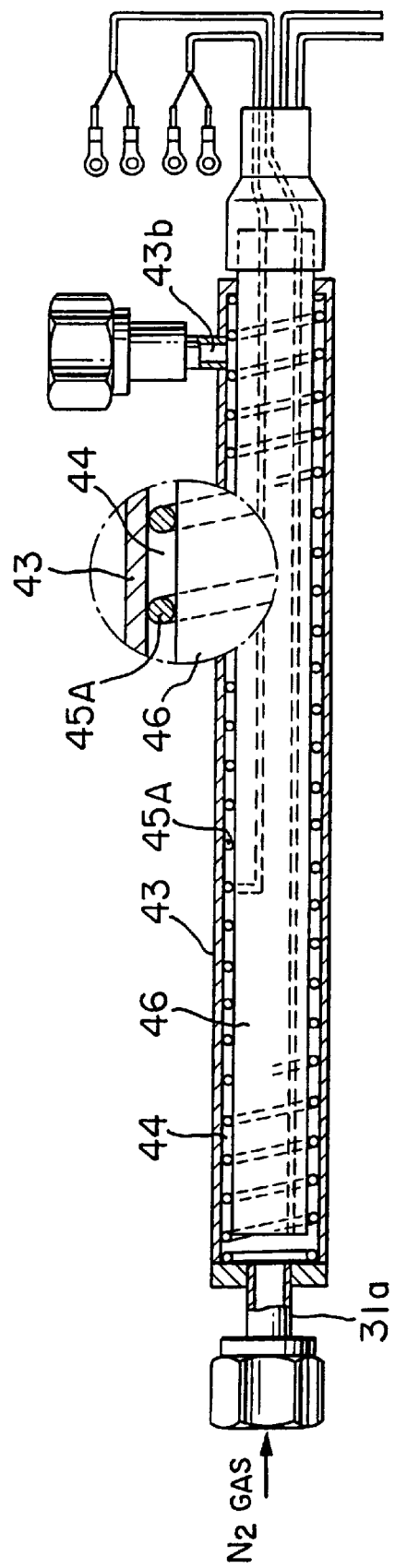
FIG. 5 is a partially enlarged sectional view of another preferred embodiment of a carrier gas heater according to the present invention.

While the spiral fluid passage 44 has been formed by the introducing pipe 43 and the fluid passage forming pipe 45 inserted into the introducing pipe 43, the spiral fluid passage 44 may be formed by the introducing pipe 43 and a coil member, e.g., a coil spring 45A, inserted into the introducing pipe 43 as shown in FIG. 5. That is, the coil spring 45A may be inserted into the introducing pipe 43 and the cartridge heater 46 may be inserted into the coil spring 45A, so that the spiral fluid passage 44 may be formed by the introducing pipe 43 and the coil spring 45A provided between the introducing pipe 43 and the cartridge heater 46.

As described above, if the spiral fluid passage 44 is formed between the introducing pipe 43 connected to the supply line 31a on the side of the $N_2$ gas source 30 and the fluid passage forming pipe 45 or the coil spring 45A, which are inserted into the introducing pipe 43, the length of the fluid passage allowing the $N_2$ gas passage to be in contact with the cartridge heater 46 can be increased, and a spiral flow can be formed so as to increase the flow velocity in comparison with the case that no spiral flow is formed. As a result, it is possible to increase the Reynolds number (Re number) and the Nusselt number (Nu number) to put the boundary layer in a turbulent region, so that it is possible to improve the efficiency of heat transfer of the heater 32. Therefore, since it is possible to effectively heat the $N_2$ gas to a predetermined temperature, e.g., 200° C., by means of a single cartridge heater 46, it is possible to reduce the size of the heater 32. Furthermore, in order to further raise the heating temperature, an outer tube heater may be provided outside the introducing pipe 43.

Figure 6:
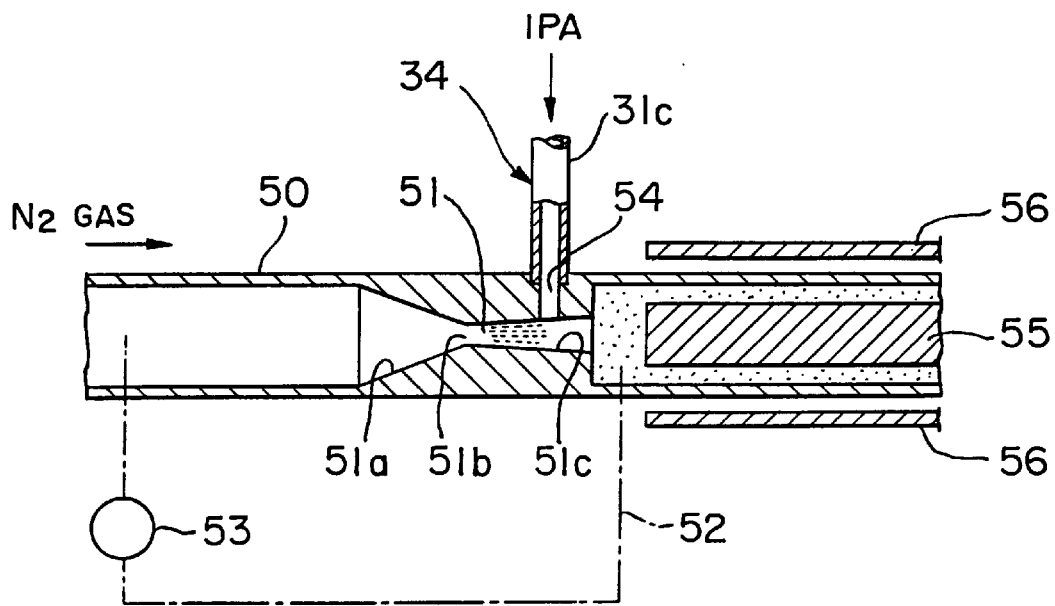
FIG. 6 is a sectional view of an embodiment of a vapor generator according to the present invention.

As shown in FIG. 6, the vapor generator 34 comprises a pipe body 50 of, e.g., stainless steel, which is connected to the carrier gas supply line 31b. On the inner peripheral surface of the pipe body 50, there is formed a shock wave forming part 51 comprising a narrowed tapered surface 51a, which is gradually narrowed in the flow direction of the carrier gas, and an expanded tapered surface 51c, which is gradually expanded from a narrowed part 51b of the narrowed tapered surface 51a in the flow direction. The shock wave forming part 51 forms a shock wave by the pressure difference between the inlet-side pressure (primary pressure) of the shock wave forming part 51 and the outlet-side pressure (secondary pressure) thereof.

Figure 7:
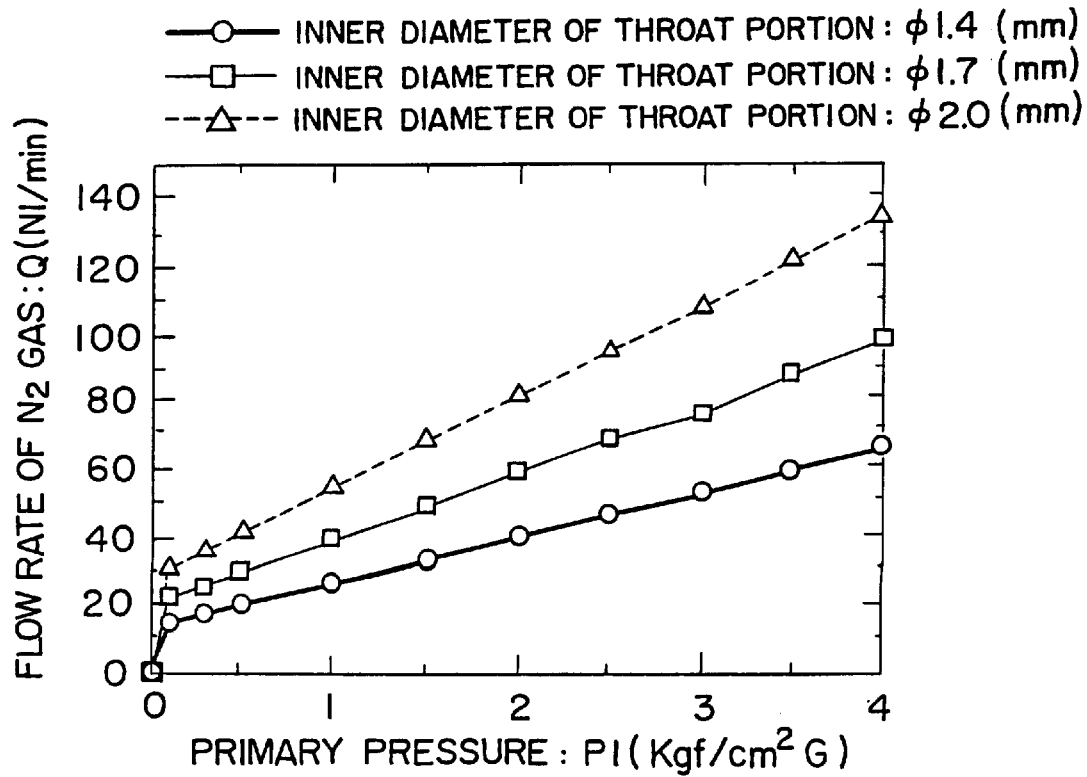
FIG. 7 is a graph showing the relationship between a primary pressure and the flow rate of a drying gas in a vapor generator.

For example, the shock wave can be formed by suitably selecting the primary pressure (kgf/cm²G) and the passing flow rate of the $N_2$ gas (Nl/min). For example, as shown in FIG. 7, assuming that the inner diameter of the narrowed part 51b is 1.4 (mm), 1.7 (mm), 2.0 (mm), if the primary pressure requires, e.g., 2 (kgf/cm²G) in relation to the secondary pressure, a shock wave is produced when the passing flow rate of the $N_2$ gas is 40 (Nl/min), 60 (Nl/min), 80 (Nl/min), respectively. In this case, if a pressure regulating valve 53 is provided in a branch line 52, which connects the primary and secondary sides of the shock wave forming part 51, the conditions of occurrence of a shock wave can be suitably set by regulating the pressure regulating valve 53.

Furthermore, if the pressure or flow rate of $N_2$ gas can be regulated in a predetermined high pressure range on the primary side, it is possible to form a shock wave without the need of the pressure regulating valve 53. That is, as shown in FIG. 12, a $N_2$ gas pressure regulating means 30a for regulating the pressure or flow rate of a $N_2$ gas is connected to a $N_2$ gas source 30, and the branch line 52 and the pressure regulating valve 53 are omitted. In this case, the $N_2$ gas source 30 must be capable of supplying $N_2$ gas having a higher pressure than that in the usual state so that a predetermined high pressure range of $N_2$ gas can be supplied. If the pressure of the $N_2$ gas supplied from the $N_2$ gas source 30 is regulated by means of the $N_2$ gas pressure regulating means 30a, the pressure difference between the inlet-side pressure (primary pressure) of the shock wave forming part 51 and the outlet-side pressure (secondary pressure) thereof can be regulated to suitably set the conditions of occurrence of the shock wave.

In the middle of the expanded tapered surface 51c of the shock wave forming part 51 thus formed, an IPA supply port 54 is formed. The IPA source 33 is connected to the IPA supply port 54 via the IPA supply pipe, i.e., the supply line 31c. In addition, an inner tube heater 55 is inserted into the pipe body 50 on the outlet side of the expanded tapered surface 51c, and an outer tube heater 56 is provided outside the pipe body 50. In this case, a heater may be provided near the shock wave forming part 51 and the IPA supply port 54.

Furthermore, as shown in FIG. 12, the flow control means supply line 31c may be provided with a flow control means 37d, such as a pump. In this case, the flow rate of IPA supplied from the IPA source 33 to the shock wave forming part 51 by the flow control means 37d can be easily controlled if necessary.

In addition, as shown in FIGS. 13(a) and 13(b), a heater 140 having similar configuration to that of the heater 32 may be used in place of the inner tube heater 55 and the outer tube heater 56.

As shown in FIG. 13(a), the heater 140 generally comprises: an introducing pipe 143 communicating with the shock wave forming part 51; a fluid passage forming pipe 145, which is inserted into the introducing pipe 143 and which forms a spiral fluid passage 144 between the inner wall surface of the introducing pipe 143 and the fluid passage forming pipe 145; and a heating means, e.g., a cartridge heater 146, which is inserted into the fluid passage forming pipe 145.

In this case, one end of the introducing pipe 143 has an inlet port 143a connected to the shock wave forming part 51, and a side of the other end thereof is provided with an outlet port 143b connected to the supply line 31d. In addition, as shown in FIG. 13(b), a spiral groove 147, such as a trapezoidal screw thread, is formed in the outer periphery of the fluid passage forming pipe 145. The spiral fluid passage 144 is formed by the spiral groove 147 and the inner wall surface 143c of the introducing pipe 143. Furthermore, the structure of the spiral fluid passage 144 should not be limited to the above structure. For example, a spiral groove may be formed in the inner wall surface of the introducing pipe 143, and the outer peripheral surface of the fluid passage forming pipe 145 may be a flat surface to form the spiral fluid passage. Alternatively, spiral grooves may be formed in both of the inner wall surface of the introducing pipe 143 and the outer peripheral surface of the fluid passage forming pipe 145 to form the spiral fluid passage. Furthermore, a heater for heating the outside of the introducing pipe 143 may be provided as a heating means in addition to the cartridge heater 146.

While the spiral fluid passage 144 has been formed by the introducing pipe 143 and the fluid passage forming pipe 145 inserted into the introducing pipe 143, the spiral fluid passage 144 may be formed by the introducing pipe 143 and a coil member, e.g., a coil spring 45A, inserted into the introducing pipe 143 as shown in FIG. 5. That is, the coil spring 45A may be inserted into the introducing pipe 143 and the cartridge heater 146 may be inserted into the coil spring 45A, so that the spiral fluid passage 144 may be formed by the introducing pipe 143 and the coil spring 45A provided between the introducing pipe 143 and the cartridge heater 146.

As described above, if the spiral fluid passage 144 is formed between the introducing pipe 143 connected to the shock wave forming part 51 and the fluid passage forming pipe 45A or the coil spring 145A, which are inserted into the introducing pipe 143, the length of the fluid passage allowing the IPA gas passage to be in contact with the cartridge heater 146 can be increased, and a spiral flow can be formed to increase the flow velocity in comparison with the case that no spiral flow is formed. As a result, it is possible to increase the Reynolds number (Re number) and the Nusselt number (Nu number) to put the boundary layer in a turbulent region, so that it is possible to improve the efficiency of heat transfer of the heater 140. Therefore, since it is possible to effectively heat the IPA gas to a predetermined temperature, e.g., 200° C., by means of the cartridge heater 146, it is possible to reduce the size of the heater 140. Furthermore, in order to raise the heating temperature, an outer tube heater may be provided outside the introducing pipe 143.

With this configuration when the IPA supplied from the IPA source 33 is supplied from the supply port 54 of the shock wave forming part 51, the shock wave formed by the shock wave forming part 51 makes the IPA misty, and then, the misty IPA is heated by the heaters 55 and 56 to produce IPA vapor. At this time, if the flow rate of $N_2$ gas is, e.g., 100 (Nl/min), when the feed rate of IPA is 1 (cc/sec), 2 (cc/sec) and 3 (cc/sec), the concentration of IPA is about 20 (%), about 30 (%) and about 40 (%), respectively.

Figure 8:
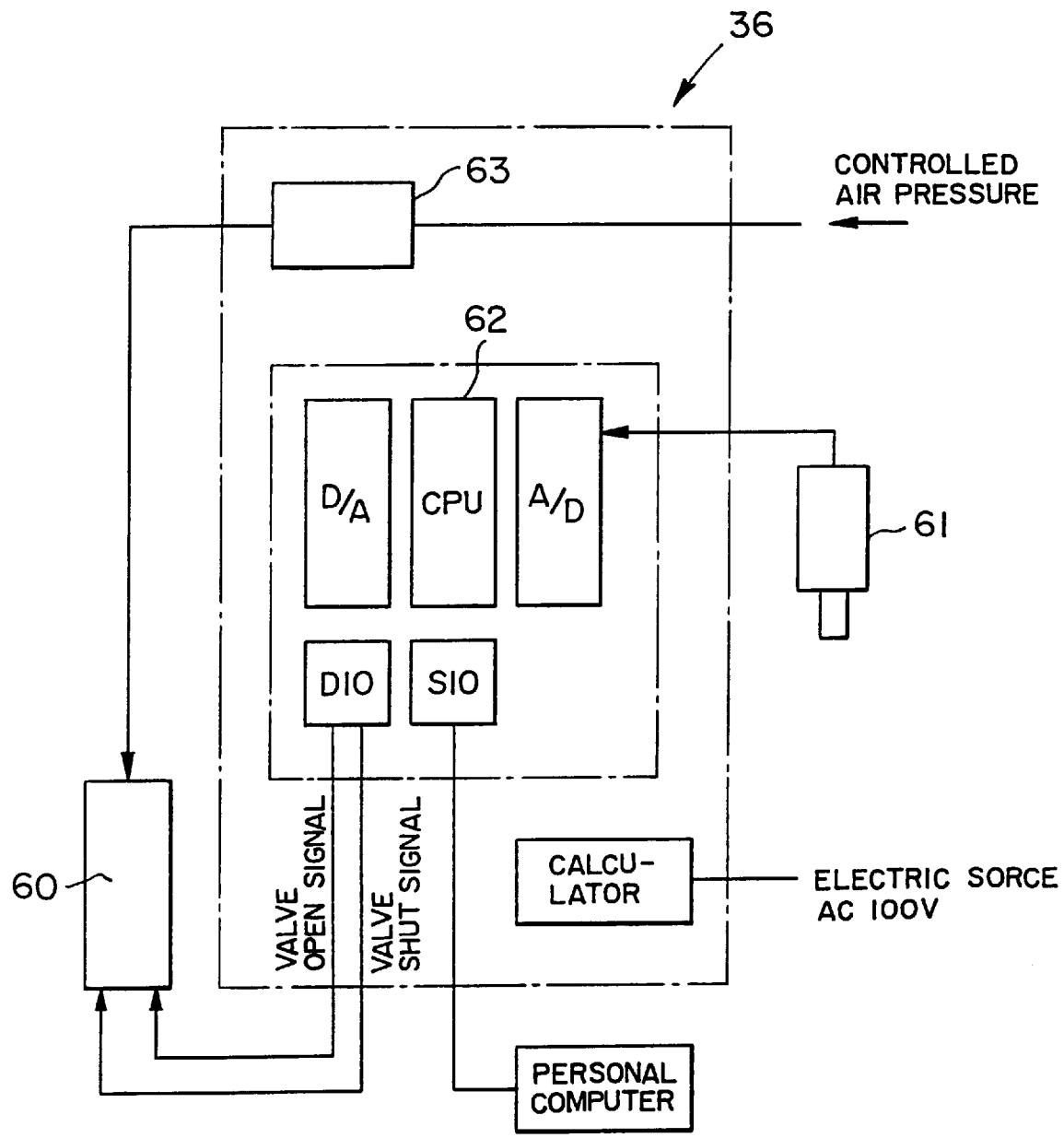
FIG. 8 is a schematic block diagram of an embodiment of a flow control means according to the present invention.

While the supply port 54 has been provided on the secondary side of the shock wave forming part 51, i.e., downstream of occurrence of the shock wave, it should not always be limited to such a configuration. The supply port 54 may be provided on the primary side of the shock wave forming part 51, i.e., upstream of occurrence of the shock wave, so that the shock wave may make the IPA misty after the $N_2$ gas is mixed with the IPA. shown in FIGS. 3 and 8, the flow control means 36 comprises: an opening-angle adjusting valve, e.g., a diaphragm valve 60, provided in the supply line 31d; a control part, e.g., a CPU (central processing unit) 62, for comparing a signal outputted from a pressure sensor 61 serving as a detecting means for detecting the pressure in the processing chamber 35, with a previously stored information; and a control valve, e.g., a micro valve 63, for controlling the working pressure of the diaphragm valve 60 on the basis of a signal outputted from the CPU 62.

Figure 9:
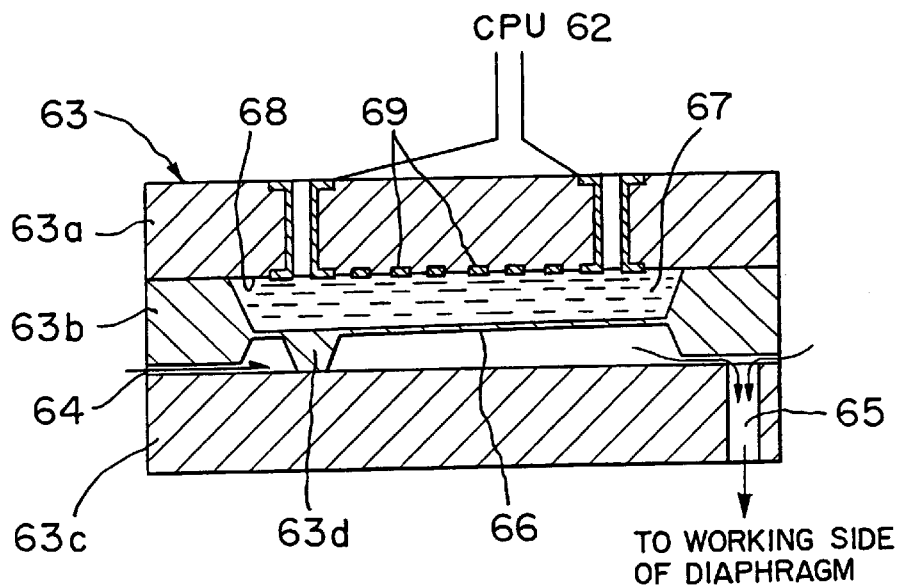
FIG. 9 is a sectional view of an embodiment of a control valve of the flow control means of FIG. 8.

In this case, for example as shown in FIG. 9, the micro valve 63 has an inlet fluid passage 64 for a working fluid, e.g., air, for the diaphragm 60. The inlet fluid passage 64 communicates with a discharge fluid passage 65. A chamber 68 for containing a control liquid, e.g., a thermal expansible oil 67, is formed on a surface facing the discharge fluid passage 65 via a flexible member 66. A plurality of resistance heaters 69 are provided on a surface facing the flexible member 66 in the chamber 68. The flexible member 66 has an intermediate member 63b provided between an upper member 63a and a lower member 63c, and a seat 63d connected to the lower member 63c. The intermediate member 63b opens and closes the discharge fluid passage 65 by the distortion of the flexible member 66. The micro valve is made of silicon.

With this configuration, when a signal outputted from the CPU 62 is digital-to-analog converted to be transmitted to the resistance heater 69, the resistance heater 69 is heated, and the control liquid, i.e., the oil 67, is expanded and contracted. Thus, the flexible member 66 moves toward the inlet to open the upper portion of the discharge fluid passage 65, so that the control fluid pressure, i.e., the gas pressure, can be adjusted. Therefore, the diaphragm valve 60 is operated by the fluid, i.e., air, which is delayed and controlled by the micro valve 63, and the previously stored information is compared with the pressure in the processing chamber 35. Thus, the operation of the diaphragm valve 60 can be controlled to supply the $N_2$ gas to the processing chamber 35, and the time to restore the pressure in the processing chamber can be controlled.

Figure 10:
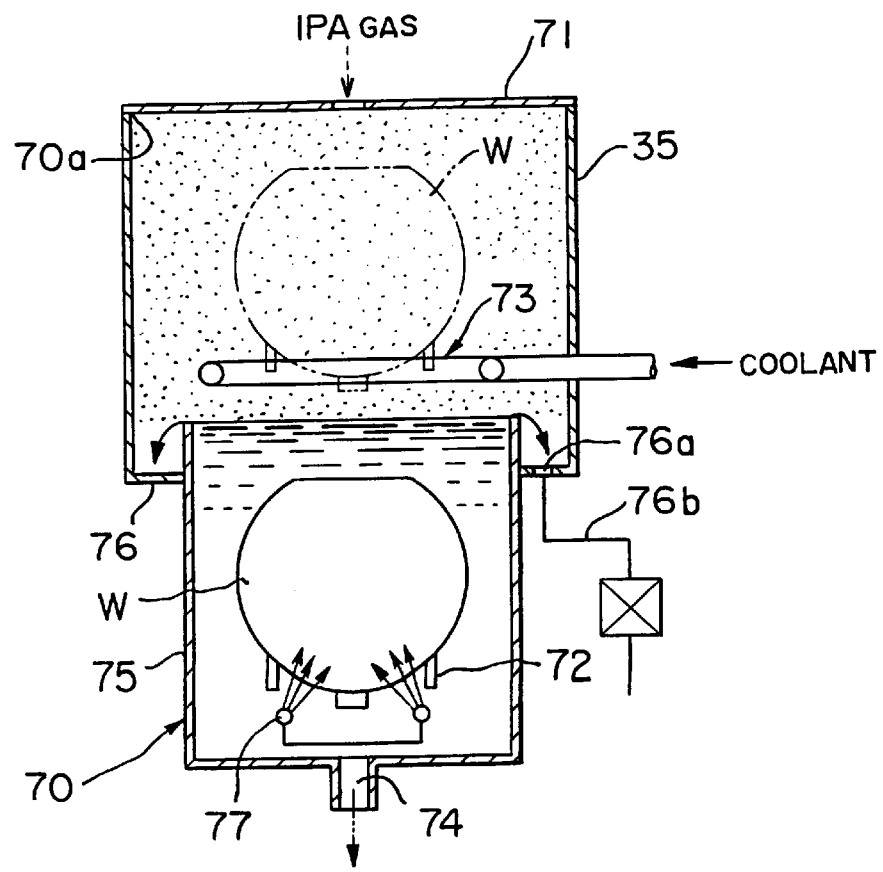
FIG. 10 is a schematic sectional view of an embodiment of a processing chamber according to the present invention.

As shown in FIG. 10, the processing chamber 35 stores or contains a cleaning solution, such as a chemical of, e.g., hydroacid fluoride, and pure water, and the processing chamber 35 is arranged above a cleaning bath 70 for immersing the wafers W in the stored cleaning solution. A lid 71 is provided so as to open and close an opening 70a, which is formed above the processing chamber 35 for carrying the wafers W in and out. Between the processing chamber 35 and the cleaning bath 70, there is provided a holding means, e.g., a wafer boat 72, for holding a plurality of wafers W, e.g., 50 wafers W, to move the wafers W into the cleaning bath 70 and the processing chamber 35. In the processing chamber 35, a cooling pipe 73 for cooling the IPA gas supplied to the processing chamber 35 may be provided.

The cleaning bath 70 comprises an inner bath 75 having a bottom with a discharge port 74, and an outer bath 76 for receiving the cleaning solution overflowing the inner bath 75. A chemical or pure water is supplied from a chemical or pure water supply nozzle 77, which is provided on the lower portion of the inner bath 75, to the inner bath 75 to be stored therein. The wafers W is immersed in the chemical or pure water stored in the inner bath 75 to be cleaned.

A discharge pipe 76b is connected to the discharge port 76a provided on the bottom of the outer bath 76. With this configuration, the cleaned wafers W are moved to the processing chamber 35 by means of the wafer boat 72 to be in contact with the IPS gas supplied to the processing chamber, so that the IPA vapor is condensed or absorbed to remove the moisture of the wafers W to dry the wafers W.

A filter 80 is provided in the supply line 31d downstream (secondary side) of the diaphragm valve 60 so as to be capable of supplying a dry gas having a small amount of particles. An insulation heater 81 is provided outside the supply line 31d so as to be capable of maintaining the temperature of the IPA gas.

Figure 11:
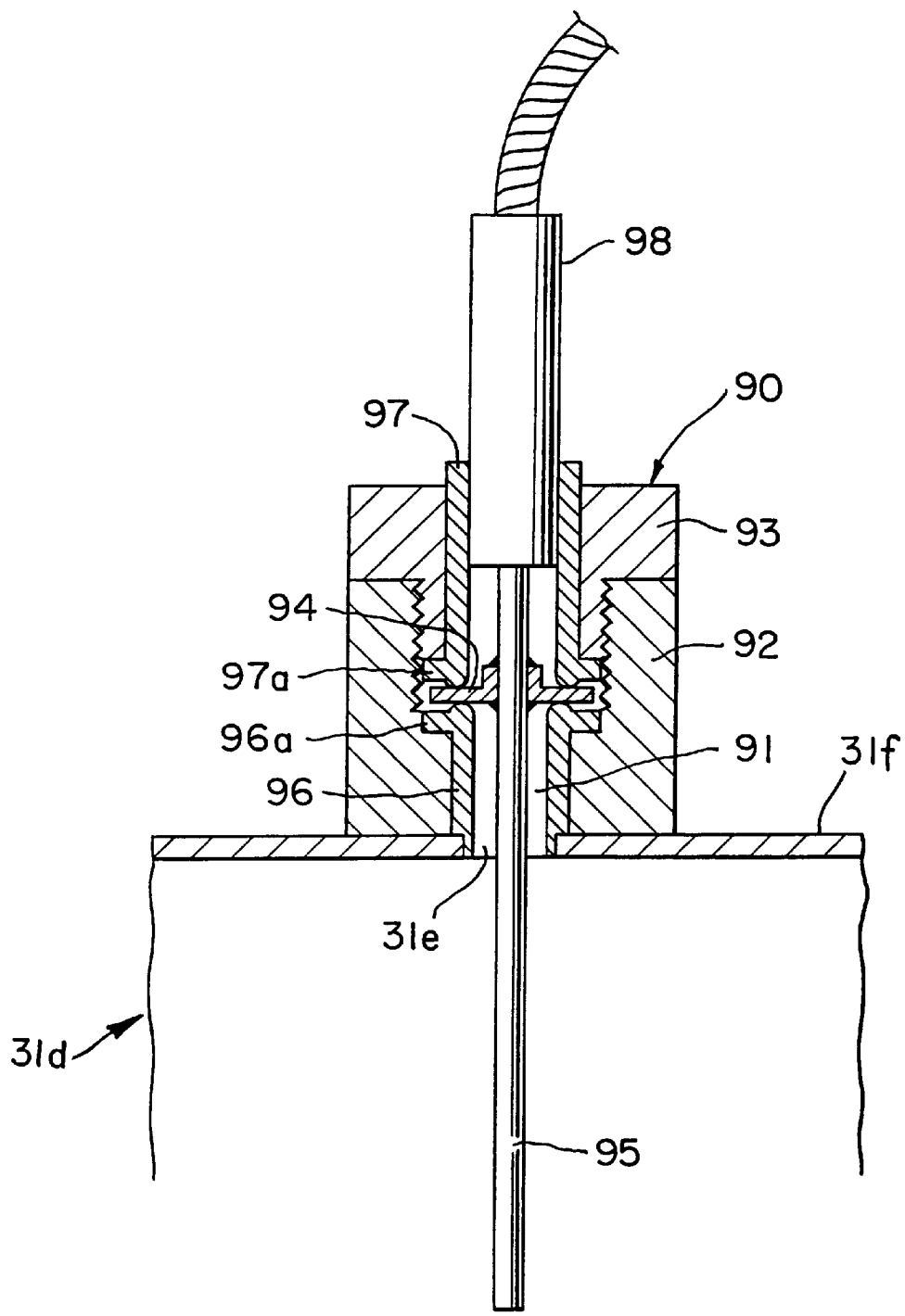
FIG. 11 is a sectional view illustrating the mounting state of a temperature detecting means according to the present invention.

An IPA gas temperature sensor 90 (a temperature detecting means) is provided in the supply line 31d on the side of the processing chamber 35 so as to measure the temperature of the IPA gas flowing through the supply line 31d. The temperature sensor 90 comprises a thermocouple 95. As shown in FIG. 11, the thermocouple 95 is fixed to a tubular body 31f of, e.g., stainless steel, which forms the supply line 31d, and fixed to a metal seal member, e.g., a metal gasket 94, by welding. The metal gasket 94 is provided between a receiving nut 92 of, e.g., stainless steel, which has a through hole 91 communicating with an insert hole 31e formed in the tubular body 31f, and a mounting nut 93 of, e.g., stainless steel, which is engaged with the receiving nut 92.

Sleeves 96 and 97 with flanges, through which the thermocouple passes, are fitted into the receiving nut 92 and the mounting nut 93, respectively. A holding cylinder 98 for fixing and holding the thermocouple 95 is fixed to the sleeve 97 of the mounting nut 93. When the temperature sensor 90 with this configuration is mounted on the supply line 31d, the metal gasket 94 is first fixed to the thermocouple 95 by welding (e.g., tig welding). Then, the tip side portion of the thermocouple 95 is inserted into the through hole 91 of the receiving nut 92 and into the insert hole 31e to be provided in the supply line 31d. Then, the mounting nut 93 is engaged with the receiving nut 92. Thus, the metal gasket 94 can be sandwiched between the flange 96a of the sleeve 96 of the receiving nut 92 and the flange 97a of the sleeve 97 of the mounting nut 93. Therefore, since it is possible to decrease the dead space of the mounting portion, the temperature of the IPA gas flowing through the supply line 31d can be accurately measured by the thermocouple 95. In addition, it is possible to prevent the external leakage, and it is possible to improve the reliability of the temperature sensor 90 with respect to the temperature cycle. While the temperature sensor 90 has been described, such a structure may be used to detect another sampling, e.g., concentration.

The operation of the preferred embodiment of a drying processing apparatus according to the present invention will be described below.

First, after the wafers W carried in the cleaning bath 70 are cleaned, the wafer boat 72 is moved upwards into the processing chamber 35. At this time, the processing chamber 35 is closed by the lid 71. In this state, the dry gas, i.e., the IPA gas, which is generated in the vapor generator 34 by the $N_2$ gas heated by the heater 32, is supplied to the processing chamber 35, so that the IPA gas contacts the wafers W. Thus, the IPA vapor is condensed or absorbed to remove the moisture of the wafers W and dry the wafers W.

When or immediately before the drying processing is completed, the supply of the IPA is stopped. During drying, the processing chamber 35 may be exhausted by the discharge pipe 76b or pressure-reduced if necessary, so that the pressure in the processing chamber 35 may be lower than atmospheric pressure. The CPU 62 compares a signal outputted from the pressure sensor 61 for detecting the pressure in the processing chamber 35 with the previously stored information to output a signal to the micro valve 63. Then, the diaphragm valve 60 is operated by the control fluid, e.g., air, delayed and controlled by the micro valve 63 to supply a small amount of $N_2$ gas to the processing chamber 35 in accordance with the pressure in the processing chamber 35, so that the atmosphere in the processing chamber 35 is gradually changed from a state below atmospheric pressure to an atmospheric pressure state. Therefore, after the drying processing, the atmosphere in the processing chamber 35 is not rapidly changed from the state below atmospheric pressure to the atmospheric pressure state, so that it is possible to prevent particles from being raised and adhered to the wafers W.

Thus, after the pressure in the processing chamber 35 is replaced with atmospheric pressure, the lid 71 is open. Then, the wafers W are delivered between the transport arm (not shown), which has moved to a position above the processing chamber, and the wafer boat 72, which has moved upwards. The transport arm, which has received the wafers W, moves from the position above the processing chamber 35 to transport the wafers W to the interface section 4.

While the above preferred embodiments of a drying processing apparatus according to the present invention have been applied to the cleaning processing system for cleaning semiconductor wafers, it may be applied to other processing systems than the cleaning processing system, or to other substrates than the semiconductor wafers, e.g., glass substrates for LCDs.

While the drying method has been used the replacement of water with IPA, the present invention may be applied to a method and apparatus for drying an object to be treated by supplying a dry gas, such as a drying apparatus utilizing the Marangoni force.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A drying processing method for supplying a dry gas to a processing chamber, which houses therein an object to be treated, to dry said object to be treated, said method comprising the steps of:

heating a carrier gas;

making a liquid for said dry gas misty by using the heated carrier gas;

heating the misty liquid together with said carrier gas and producing said dry gas; and supplying said dry gas to said processing chamber while controlling a flow rate of said dry gas.

2. A drying processing apparatus for supplying a dry gas to a processing chamber, which houses therein an object to be treated, to dry said object to be treated, said apparatus comprising:

carrier gas heating means for heating a carrier gas; and a vapor generator having a mist making port for making a liquid for said dry gas misty by using said carrier gas heated by said heating means and a heating port for heating the misty liquid together with said carrier gas and producing said dry gas.

3. A drying processing apparatus as set forth in claim 2, which further comprises flow control means for supplying said dry gas to said processing chamber at a predetermined rate.

4. A drying processing apparatus as set forth in claim 2, wherein said carrier gas heating means comprises:

an introducing pipe, which communicates with a carrier gas supply line;

a fluid passage forming pipe, which is inserted into said introducing pipe to form a spiral fluid passage for passing said carrier gas between an inner wall surface of said introducing pipe and said fluid passage forming pipe; and heating means, which is inserted into at least said fluid passage forming pipe.

5. A drying processing apparatus as set forth in claim 2, wherein said carrier gas heating means comprises:

an introducing pipe, which communicates with a carrier gas supply line;

a coil member, which is inserted into said introducing pipe to form a spiral fluid passage for passing said carrier gas between an inner wall surface of said introducing pipe and said coil member; and heating means, which is inserted into at least said coil member.

6. A drying processing apparatus as set forth in claim 2, wherein said vapor generating means comprises:

a shock wave forming part, which is formed in a tubular body communicating with a carrier gas supply line;

a supply port for supplying said liquid for the dry gas to a location near said shock wave forming part; and heating means provided inside and outside said tubular body near or downstream of said shock wave forming part and said supply port.

7. A drying processing apparatus as set forth in claim 3, wherein said flow control means comprises:

an opening-angle adjusting valve provided in a supply line for said dry gas;

a control part for comparing a signal outputted from detecting means for detecting a pressure in said processing chamber, with a previously stored information; and a control valve for controlling a working pressure of said opening-angle adjusting valve on the basis of a signal outputted from said control part.

8. A drying processing apparatus as set forth in claim 2, which further comprises temperature detecting means for detecting a temperature of said dry gas, said temperature detecting means being provided in a supply line for said dry gas.

9. A drying processing apparatus as set forth in claim 8, wherein said temperature detecting means comprises a thermocouple, which is fixed to a metal seal member by welding, said metal seal member being provided between a receiving nut fixed to a tubular body forming said supply line and a mounting nut engaged with said receiving nut.

10. A drying processing apparatus as set forth in claim 2, wherein said vapor generating means comprises:

a shock wave forming part, which is formed in a tubular body communicating with a carrier gas supply line;

a supply port for supplying said liquid for the dry gas to a location near said shock wave forming part; and heating means provided inside or outside said tubular body near or downstream of said shock wave forming part and said supply port.

* * * * *